(12) United States Patent
Ku

(10) Patent No.: US 8,994,419 B2
(45) Date of Patent: Mar. 31, 2015

(54) SEMICONDUCTOR DEVICE, SEMICONDUCTOR SYSTEM INCLUDING THE SAME, AND METHOD FOR OPERATING THE SAME

(71) Applicant: SK hynix Inc., Gyeonggi-do (KR)

(72) Inventor: Young-Jun Ku, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/109,667

(22) Filed: Dec. 17, 2013

(65) Prior Publication Data

US 2015/0048870 A1 Feb. 19, 2015

(30) Foreign Application Priority Data

Aug. 19, 2013 (KR) .................. 10-2013-0097787

(51) Int. Cl.
*H03L 7/00* (2006.01)
*H03K 5/13* (2014.01)

(52) U.S. Cl.
CPC ..................... *H03K 5/131* (2013.01)
USPC .......................... 327/152; 327/144

(58) Field of Classification Search
USPC .................................. 327/144, 152
See application file for complete search history.

(56) References Cited

U.S. PATENT DOCUMENTS

| | | | |
|---|---|---|---|
| 5,524,281 A * | 6/1996 | Bradley et al. ............. | 455/67.15 |
| 6,449,517 B1 * | 9/2002 | Lee .................. | 700/83 |
| 8,626,083 B2 * | 1/2014 | Greene et al. ............... | 455/77 |
| 8,643,423 B2 * | 2/2014 | Zhang et al. ................. | 327/306 |
| 2007/0235768 A1 * | 10/2007 | Nakazawa et al. ............. | 257/211 |
| 2008/0136390 A1 * | 6/2008 | Briere ......................... | 323/282 |
| 2010/0123945 A1 * | 5/2010 | Kai .............................. | 359/239 |
| 2010/0237842 A1 * | 9/2010 | Ishimori et al. .............. | 323/282 |
| 2011/0018604 A1 * | 1/2011 | Chang et al. ................. | 327/306 |
| 2011/0095736 A1 * | 4/2011 | Briere ......................... | 323/271 |
| 2011/0267127 A1 * | 11/2011 | Staszewski et al. ........... | 327/306 |
| 2012/0248565 A1 * | 10/2012 | Tasaka ........................ | 257/472 |
| 2013/0015886 A1 * | 1/2013 | Johnson ...................... | 327/109 |
| 2013/0069704 A1 * | 3/2013 | Zhang et al. ................. | 327/306 |
| 2013/0124134 A1 * | 5/2013 | Gohel ......................... | 702/120 |
| 2013/0287231 A1 * | 10/2013 | Kropfitsch .................. | 381/113 |
| 2014/0097895 A1 * | 4/2014 | Khlat et al. ................. | 330/251 |
| 2014/0125395 A1 * | 5/2014 | Zhang et al. ................. | 327/306 |
| 2014/0225581 A1 * | 8/2014 | Giuliano et al. ............. | 323/282 |

FOREIGN PATENT DOCUMENTS

KR 1020050041701 5/2005
KR 101187639 10/2012

* cited by examiner

*Primary Examiner* — Adam Houston
(74) *Attorney, Agent, or Firm* — IP & T Group LLP

(57) ABSTRACT

A semiconductor device may include first to fourth output lines, an input signal latch unit suitable for latching first to fourth input signals that are sequentially inputted in response to first to fourth clocks having sequential phases, respectively, a valid signal latch unit suitable for latching a valid signal in response to one clock among the first to fourth clocks, where the valid signal corresponds to one input signal among the first to fourth input signals and represents whether the corresponding input signal is valid or not, and a signal transfer unit suitable for transferring the latched input signals, which are obtained by latching the input signals in response to the first to fourth clocks, to the first to fourth output lines based on a correspondence relationship that is decided based on a valid signal latch result of the valid signal latch unit.

21 Claims, 10 Drawing Sheets

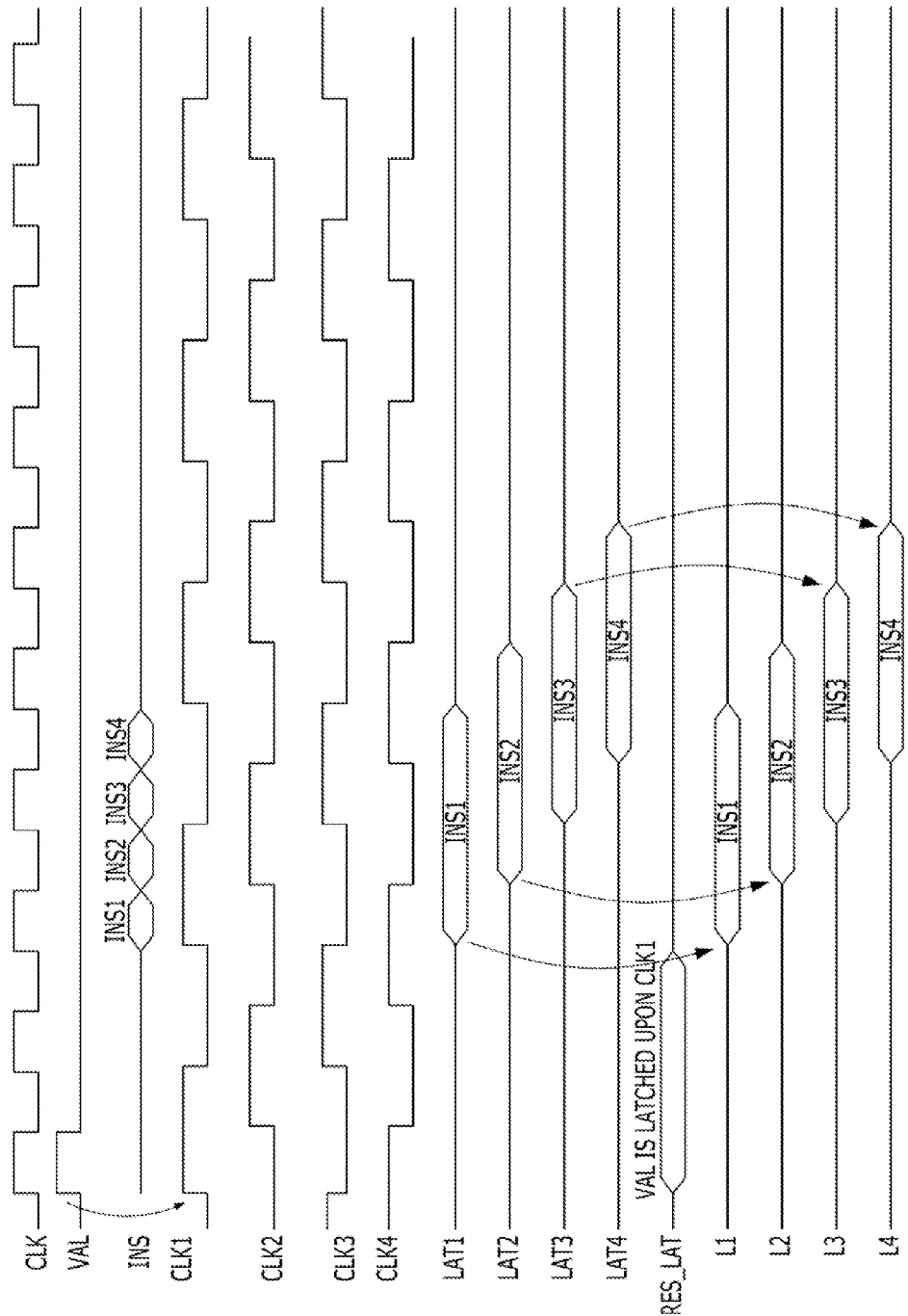

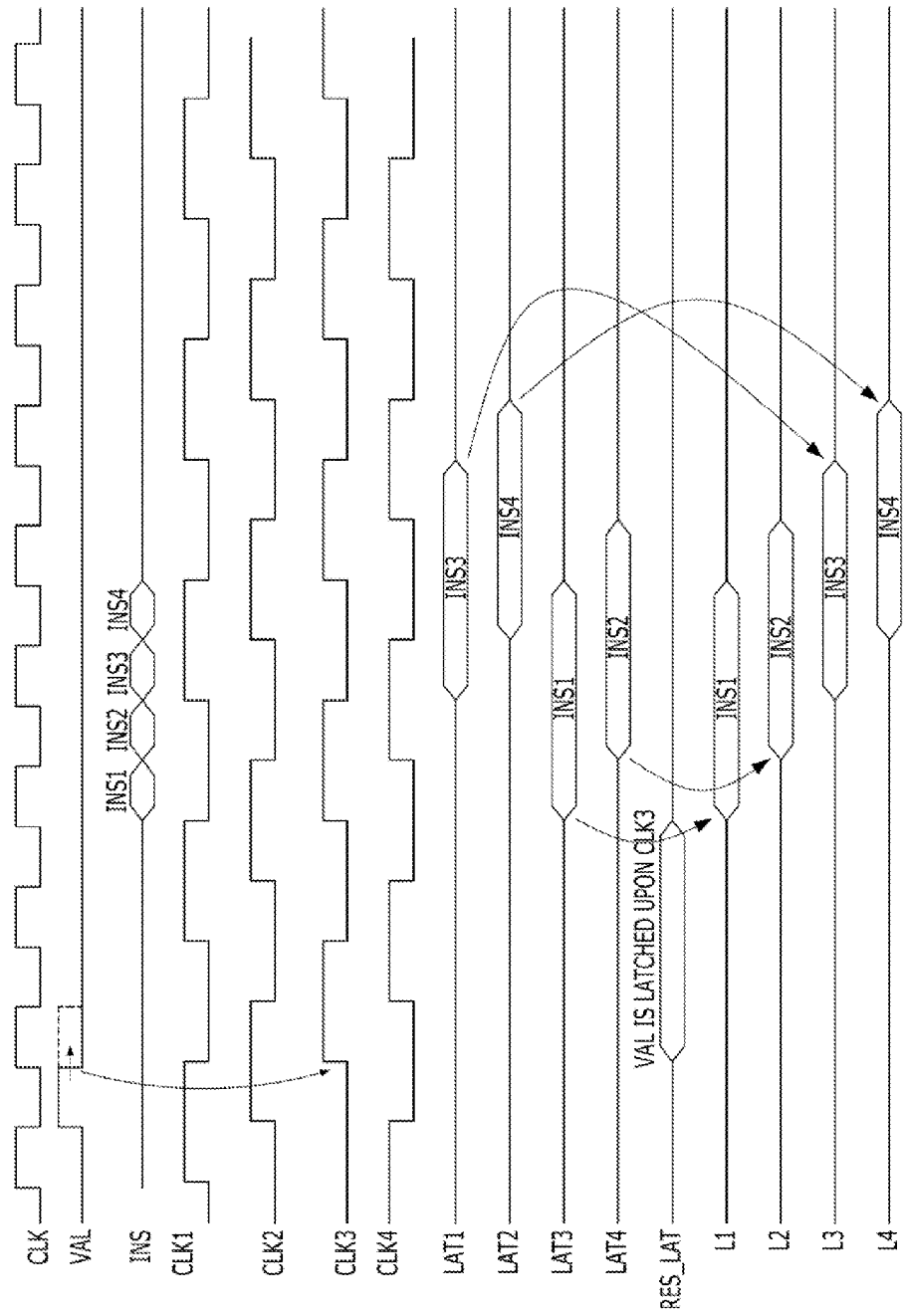

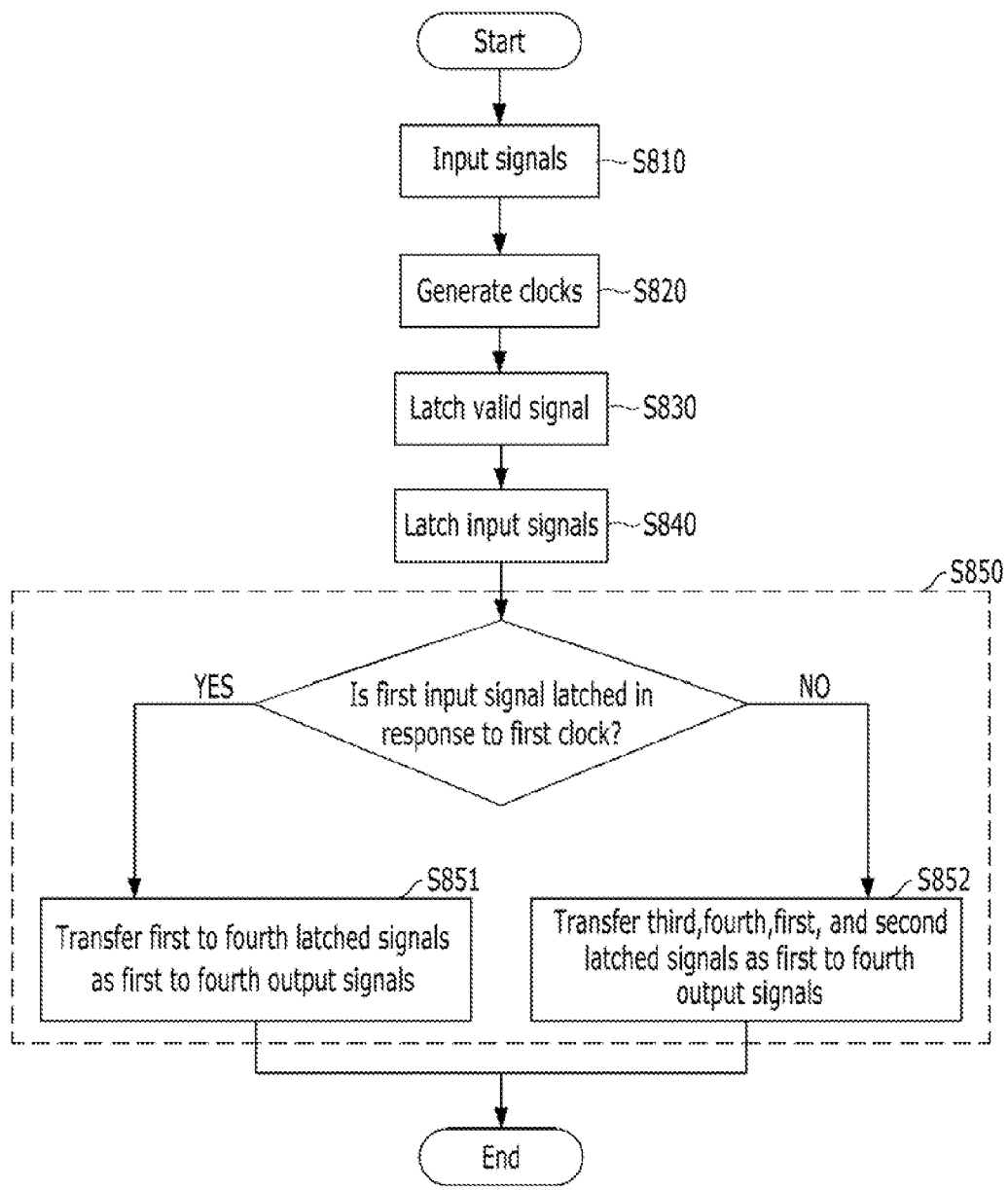

SEMICONDUCTOR DEVICE, SEMICONDUCTOR SYSTEM INCLUDING THE SAME, AND METHOD FOR OPERATING THE SAME

CROSS-REFERENCE TO RELATED APPLICATIONS

The present application claims priority of Korean Patent Application No. 10-2013-0097787, filed on Aug. 19, 2013, which is incorporated herein by reference in its entirety.

BACKGROUND

1. Field

Exemplary embodiments of the present invention relate to a semiconductor device capable of determining a transmission sequence of input signals by using a valid signal and transmitting the input signals in the transmission sequence, a semiconductor system including the semiconductor device, and a method for operating the semiconductor device.

2. Description of the Related Art

Generally, a semiconductor memory device for storing data and inputting/outputting the data includes a command pin for receiving a command, an address pin for receiving an address, a data pin for inputting/outputting a data, and a power pin for receiving a power supply voltage.

Among semiconductor memory devices, a Dynamic Random Access Memory (DRAM) device may include only a command pin and may generate basic commands such as an active command, a read command, a write command, a precharge command, and a no-operation command through a combination of command signals such as, a row address strobe signal RASB, a column address strobe signal CASB, a chip selection signal CSB, an active signal ACTB, and a write enable signal WEB, that are applied to the command pin.

As technology advances, semiconductor memory devices may operate at a higher speed, be more highly integrated, and become smaller. They may also provide diverse additional functions, which have not been provided before. To generate commands for the diverse additional functions and achieve high-speed operation, command signals are required to be in the form of packets. Therefore, diverse methods are being developed for receiving the command signals in the form of packets and processing the received packets.

SUMMARY

An embodiment of the present invention is directed to a semiconductor device that transfers multiple command signals that are inputted sequentially in a packet having a length of one or more clocks, to corresponding lines in the input order of the command signals regardless of what clock is used to latch the command signals, based on a valid signal for indicating that a command signal is valid, a semiconductor system including the semiconductor device, and a method for operating the semiconductor device.

Another embodiment of the present invention is directed to a semiconductor device that may process command signals of a packet type to operate at a high speed and may perform diverse additional operations, a semiconductor system including the semiconductor device, and a method for operating the semiconductor device.

In accordance with an embodiment of the present invention, a semiconductor device includes first to fourth output lines; an input signal latch unit suitable for latching first to fourth input signals that are sequentially inputted in response to first to fourth clocks having sequential phases, respectively; a valid signal latch unit suitable for latching a valid signal in response to one clock among the first to fourth clocks, where the valid signal corresponds to one input signal among the first to fourth input signals and represents whether the corresponding input signal is valid or not; and a signal transfer unit suitable for transferring the latched input signals, which are obtained by latching the input signals in response to the first to fourth clocks, to the first to fourth output lines based on a correspondence relationship that is decided based on a valid signal latch result of the valid signal latch unit.

In accordance with another embodiment of the present invention, a semiconductor system includes a controller suitable for generating a clock signal, at least one command packet including first to fourth sequential command signals, and a valid signal corresponding to one of the first to fourth command signals representing whether or not the one command signal is valid, and a semiconductor device suitable for generating first to fourth clocks synchronized with first to fourth edges of the clock signal, respectively, latching the command packet in response to the first to fourth clocks to output first to fourth latched command signals, respectively, latching the valid signal using the first to fourth clocks to output a valid signal latch result, transferring the first to fourth latched command signals to first to fourth command lines in an order determined by the valid signal latch result, and performing a set operation corresponding to the at least one command packet.

In accordance with yet another embodiment of the present invention, a method for operating a semiconductor device includes inputting a clock signal, first to fourth input signals, and a valid signal which corresponds to one input signal among the first to fourth input signals and represents whether or not the one input signal is valid, generating first to fourth clocks synchronized with first to fourth edges of the clock signal, where the first edge and the third edge are of the same kind while the second edge and the fourth edge are of the same kind, latching the valid signal using the first to fourth clocks and outputting a valid signal latch result, latching the input signals in response to the first to fourth clocks to output first to fourth latched input signals, respectively, and transferring the latched input signals as first to fourth output signals in an order determined by the valid signal latch result.

In accordance with still another embodiment of the present invention, a semiconductor device includes: a plurality of output lines; an input signal latch unit suitable for latching a plurality of input signals that are sequentially inputted in response to a plurality of clocks having sequential phases, respectively; a valid signal latch unit suitable for latching a valid signal in response to one clock among the multiple clocks, where the valid signal corresponds to one input signal among the multiple input signals and represents whether the corresponding input signal is valid or not; and a signal transfer unit suitable for transferring the latched input signals, which are obtained by latching the input signals in response to the multiple clocks, to the multiple output lines based on a correspondence relationship that is decided based on a valid signal latch result of the valid signal latch unit.

BRIEF DESCRIPTION OF THE DRAWINGS

FIGS. 5A to 5D are waveform diagrams describing an operation of the semiconductor device;

FIG. 8 is a flowchart describing a method for operating a semiconductor device in accordance with an embodiment of the present invention.

DETAILED DESCRIPTION

Figure 1:
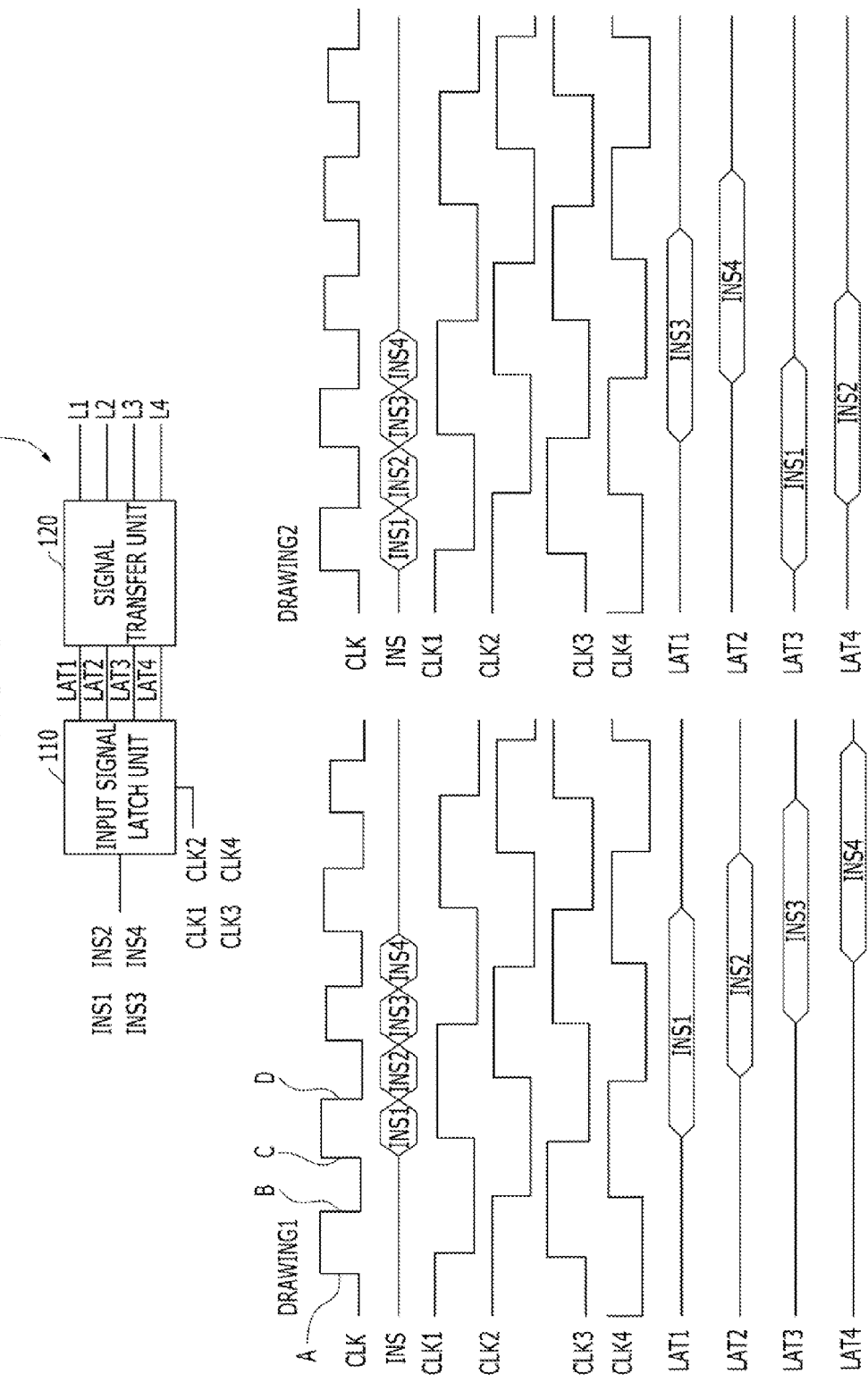
FIG. 1 is a block diagram illustrating a semiconductor device for processing input signals INS1 to INS4 that are inputted in the form of a packet and a waveform diagram describing an operation of the semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a semiconductor device 100 for processing input signals INS1 to INS4 that are inputted in the form of a packet and a waveform diagram describing an operation of the semiconductor device 100. The semiconductor device 100 includes an input signal latch unit 110, a signal transfer unit 120, and first to fourth output lines L1 to L4.

The input signal latch unit 110 latches input signals INS1 to INS4 that are inputted in the form of a packet in response to first to fourth clocks CLK1 to CLK4 and transfers them to first to fourth latch lines LAT1 to LAT4. Herein, the input signal latched in response to a first clock CLK1 is transferred to the first latch line LAT1, and the input signal latched in response to a second clock CLK2 is transferred to the second latch line LAT2. The input signal latched in response to a third clock CLK3 is transferred to the third latch line LAT3, and the input signal latched in response to a fourth clock CLK4 is transferred to the fourth latch line LAT4.

The cycles of the first to fourth clocks CLK1 to CLK4 are twice as long as the cycle of the clock signal CLK, and the first clock CLK1 is a clock that is synchronized with a first rising edge A of the clock signal CLK, and the second clock CLK2 is a clock that is synchronized with a first falling edge B of the clock signal CLK. The third clock CLK3 is a clock that is synchronized with a second rising edge C of the clock signal CLK, and the fourth clock CLK4 is a clock that is synchronized with a second falling edge D of the clock signal CLK.

The signal transfer unit 120 transfers the first to fourth input signals INS1 to INS4 loaded on the first to fourth latch lines LAT1 to LAT4 to the first to fourth output lines L1 to L4. Since the first to fourth input signals INS1 to INS4 have different functions depending on their input orders, the first to fourth input signals INS1 to INS4 are transferred in the order that they are inputted. That is, the first to fourth input signals INS1 to INS4 are to be transferred to the first to fourth output lines L1 to L4, respectively, in order to be transferred to appropriate locations thereby enabling the semiconductor device 100 to perform a predetermined operation.

The first waveform DRAWING1 illustrates a case where the first input signal INS1 is latched in response to the first clock CLK1, and the second waveform DRAWING2 illustrates a case where the first input signal INS1 is latched in response to the third clock CLK3. The latched signals are loaded on the first to fourth latch lines LAT1 to LAT4.

As illustrated in the waveforms DRAWING1 and the DRAWING2, the input signals INS1 to INS4 loaded on the first to fourth latch lines LAT1 to LAT4 are different depending on what clock is used to latch the first input signal INS1. Therefore, the corresponding relationship between the first to fourth latch lines LAT1 to LAT4 and the first to fourth output lines L1 to L4 varies depending on what clock is used to latch the first input signal INS1.

Figure 2:
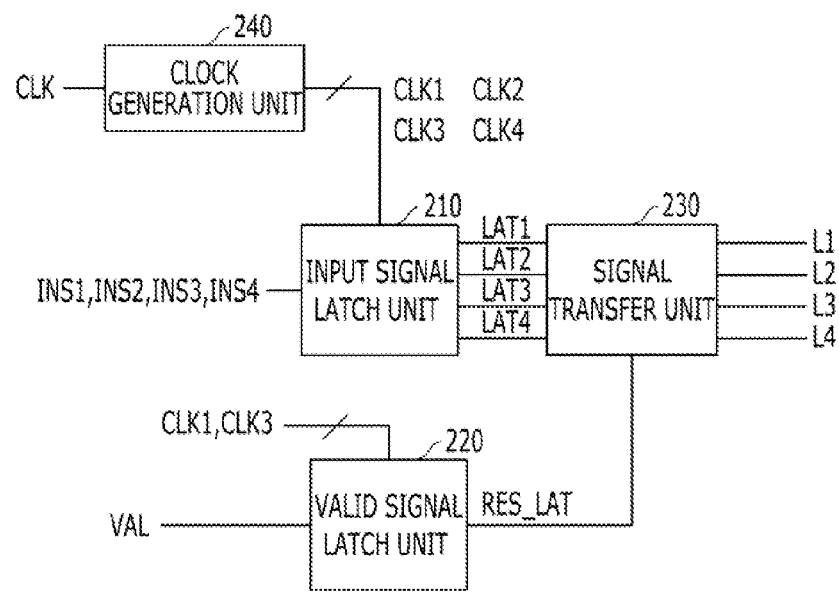
FIG. 2 is a block diagram illustrating a semiconductor device in accordance with an embodiment of the present invention.

FIG. 2 is a block diagram illustrating a semiconductor device in accordance with an embodiment of the present invention. The semiconductor device performs an operation of transferring input signals INS1 to INS4 to first to fourth output lines L1 to L4.

Referring to FIG. 2, the semiconductor device includes first to fourth output lines L1 to L4, an input signal latch unit 210, a valid signal latch unit 220, a signal transfer unit 230, and a clock generation unit 240. The input signal latch unit 210 latches first to fourth input signals INS1 to INS4 that are sequentially inputted in response to first to fourth clocks CLK1 to CLK4 having sequential phases. The valid signal latch unit 220 latches a valid signal VAL in response to one clock among the first to fourth clocks CLK1 to CLK4.

The signal transfer unit 230 transfers the latched input signals, which are obtained by latching the input signals INS1 to INS4 in response to the first to fourth clocks CLK1 to CLK4, to the first to fourth output lines L1 to L4 based on the corresponding relationship that is determined by a latch result RES_LAT of the valid signal latch unit 220. The clock generation unit 240 generates the first to fourth clocks CLK1 to CLK4 based on a clock signal CLK.

As illustrated in FIG. 1, the first to fourth input signals INS1 to INS4 are inputted in a high section or a low section of the clock signal CLK, and the length of the first to fourth input signals INS1 to INS4 may be a half of the cycle of the clock signal CLK. The valid signal VAL shown in FIG. 2, is a signal inputted in the high section or the low section of the clock signal CLK, and it corresponds to one input signal among the first to fourth input signals INS1 to INS4 and represents whether or not the corresponding input signal INS is valid. The valid signal VAL may be inputted ahead of the corresponding input signal INS by (1) an odd-number or (2) an even-number of cycles of the clock signal CLK.

The clock generation unit 240 generates the first to fourth clocks CLK1 to CLK4 by using the clock signal CLK. The first to fourth clocks CLK1 to CLK4 are clocks used for latching the first to fourth input signals INS1 to INS4. The cycles of the first to fourth clocks CLK1 to CLK4 may be twice as long as the cycles of the clock signal CLK. The clock generation unit 240 generates the first to fourth clocks CLK1 to CLK4 in synchronization with first to fourth edges of the clock signal CLK, respectively. The first edge and the third edge may be rising edges, while the second edge and the fourth edge may be falling edges, or the first edge and the third edge may be falling edges, while the second edge and the fourth edge may be rising edges. Described hereafter is a case where the first edge and the third edge are rising edges while the second edge and the fourth edge are falling edges.

The input signal latch unit 210 latches the first to fourth input signals INS1 to INS4 by using the first to fourth clocks CLK1 to CLK4, and transfers the latched input signals to the first to fourth latch lines LAT1 to LAT4. Specifically, among the first to fourth input signals INS1 to INS4, the input signal latch unit 210 transfers the input signal latched in response to the first clock CLK1 to the first latch line LAT1, transfers the input signal latched in response to the second clock CLK2 to the second latch line LAT2, transfers the input signal latched in response to the third clock CLK3 to the third latch line LAT3, and transfers the input signal latched in response to the fourth clock CLK4 to the fourth latch line LAT4. The length of the first to fourth input signals INS1 to INS4 that are transferred to the first to fourth latch lines LAT1 to LAT4 may be twice as long as the cycle of the clock signal CLK.

The first input signal INS1 may be latched in response to the first clock CLK1 or the third clock CLK3. When the first input signal INS1 is latched in response to the first clock CLK1, the second to fourth input signals INS2 to INS4 are latched in response to the second to fourth clocks CLK2 to CLK4, respectively. When the first input signal INS1 is latched in response to the third clock CLK3, the second input signal INS2 is latched in response to the fourth clock CLK4, and the third and fourth input signals INS3 and INS4 are latched in response to the first and second clocks CLK1 and CLK2, respectively.

The valid signal latch unit 220 latches the valid signal VAL in response to one clock among the first to fourth clocks CLK1 to CLK4. The latch result RES_LAT represents what clock is used to latch the valid signal VAL. When the valid signal VAL corresponds to the first input signal INS1 or the third input signal INS3, the valid signal latch unit 220 latches the valid signal VAL using at least one clock between the first clock CLK1 and the third clock CLK3. When the valid signal VAL corresponds to the second input signal INS2 or the fourth input signal INS4, the valid signal latch unit 220 latches the valid signal VAL using at least one clock between the second clock CLK2 and the fourth clock CLK4.

Since the first to fourth input signals INS1 to INS4 are inputted sequentially, if we know which clock is used to latch the first input signal INS1, it may be determined which clocks are used to latch the rest of the input signals. Hereafter, this is described based on the first input signal INS1.

The following is an example of operation when the valid signal VAL is inputted ahead of the corresponding input signal by an odd-number of cycles of the clock signal CLK.

The first input signal INS1 is latched in response to the first clock CLK1, when the valid signal VAL corresponds to the first input signal INS1 and the valid signal VAL is latched in response to the third clock CLK3, when the valid signal VAL corresponds to the second input signal INS2 and the valid signal VAL is latched in response to the fourth clock CLK4, when the valid signal VAL corresponds to the third input signal INS3 and the valid signal VAL is latched in response to the first clock CLK1, and when the valid signal VAL corresponds to the fourth input signal INS4 and the valid signal VAL is latched in response to the second clock CLK2.

The first input signal INS1 is latched in response to the third clock CLK3, when the valid signal VAL corresponds to the first input signal INS1 and the valid signal VAL is latched in response to the first clock CLK1, when the valid signal VAL corresponds to the second input signal INS2 and the valid signal VAL is latched in response to the second clock CLK2, when the valid signal VAL corresponds to the third input signal INS3 and the valid signal VAL is latched in response to the third clock CLK3, and when the valid signal VAL corresponds to the fourth input signal INS4 and the valid signal VAL is latched in response to the fourth clock CLK4.

The following is an example of operation when the valid signal VAL is inputted ahead of the corresponding input signal by an even-number of cycles of the clock signal CLK.

The first input signal INS1 is latched in response to the third clock CLK3, when the valid signal VAL corresponds to the first input signal INS1 and the valid signal VAL is latched in response to the third clock CLK3, when the valid signal VAL corresponds to the second input signal INS2 and the valid signal VAL is latched in response to the fourth clock CLK4, when the valid signal VAL corresponds to the third input signal INS3 and the valid signal VAL is latched in response to the first clock CLK1, and when the valid signal VAL corresponds to the fourth input signal INS4 and the valid signal VAL is latched in response to the second clock CLK2.

The first input signal INS1 is latched in response to the first clock CLK1, when the valid signal VAL corresponds to the first input signal INS1 and the valid signal VAL is latched in response to the first clock CLK1, when the valid signal VAL corresponds to the second input signal INS2 and the valid signal VAL is latched in response to the second clock CLK2, when the valid signal VAL corresponds to the third input signal INS3 and the valid signal VAL is latched in response to the third clock CLK3, and when the valid signal VAL corresponds to the fourth input signal INS4 and the valid signal VAL is latched in response to the fourth clock CLK4.

The signal transfer unit 230 transfers the first to fourth input signals INS1 to INS4 of the first to fourth latch lines LAT1 to LAT4 to the first to fourth output lines L1 to L4 based on the corresponding relationship that is determined by the latch result RES_LAT of the valid signal latch unit 220.

The signal transfer unit 230 transfers the respective input signals latched in response to the first to fourth clocks CLK1 to CLK4 to the first to fourth output lines L1 to L4, in response to the latch result RES_LAT indicating the result that the first input signal INS1 is latched in response to the first clock CLK1 among the above-described latch results of the valid signal VAL.

The signal transfer unit 230 transfers the respective input signals latched in response to the first and second clocks CLK1 and CLK2 to the third and fourth output lines L3 and L4, and transfers the respective input signals latched in response to the third and fourth clocks CLK3 and CLK4 to the first and second output lines L1 and L2 in response to the latch result RES_LAT indicating the result that the first input signal INS1 is latched in response to the third clock CLK3 among the above-described latch results of the valid signal VAL.

For example, the first input signal INS1 is latched in response to the third clock CLK3 when the valid signal VAL corresponds to the first input signal INS1 and is inputted ahead of the first input signal INS1 by an odd-number of cycles of the clock signal CLK and when the valid signal latch unit 220 latches the valid signal VAL in response to the first clock CLK1. Thus, the signal transfer unit 230 transfers the input signal latched in response to the first clock CLK1 to the third output line L3, transfers the input signal latched in response to the second clock CLK2 to the fourth output line L4, and transfers the respective input signals latched in response to the third and fourth clocks CLK3 and CLK4 to the first and second output lines L1 and L2. When the valid signal latch unit 220 latches the valid signal VAL in response to the first clock CLK1, the first input signal INS1 is latched in response to the first clock CLK1. Thus, the signal transfer unit 230 transfers the respective input signals latched in response to the first to fourth clocks CLK1 to CLK2 to the first to fourth output lines L1 to L4.

That is, when the valid signal VAL is inputted ahead of the input signal corresponding to the valid signal VAL by an odd-number of cycles of the clock signal CLK, a clock that latches the valid signal VAL is different from a clock that latches the input signal corresponding to the valid signal VAL. Also, when the valid signal VAL is inputted ahead of the input signal corresponding to the valid signal VAL by an even-number of cycles of the clock signal CLK, the clock latching the valid signal VAL is the same as the clock latching the input signal corresponding to the valid signal VAL.

As described above, the semiconductor device in accordance with the embodiment of the present invention transfers the input signals that are sequentially inputted to the predetermined output lines in the order that they are inputted by using the valid signal VAL regardless of which clock is used to latch the input signals among multiple clocks having different phases. Therefore, the order that the multiple input signals are inputted may be accurately known in the semiconductor device. Knowing an input order of the input signal means that its function depending on the input order may be determined. Therefore, the functions of the input signals that are inputted in the form of a packet may be accurately detected and the input signals may be used according to their functions.

Figure 3:
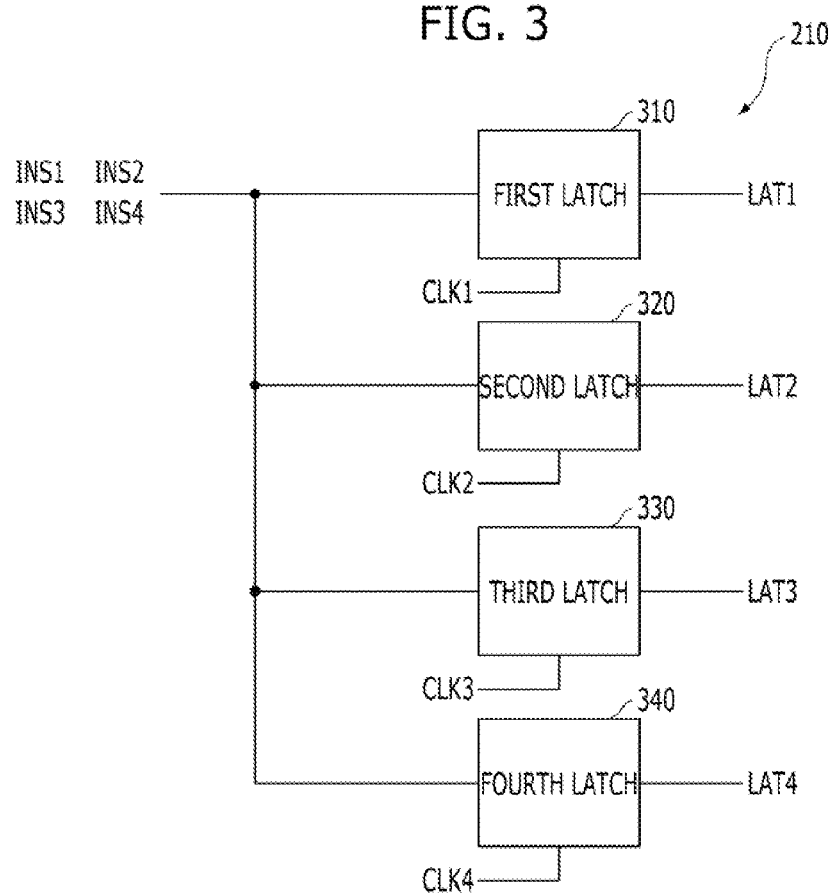
FIG. 3 is a block diagram illustrating an input signal latch unit 210 shown in FIG. 2.

FIG. 3 is a block diagram illustrating the input signal latch unit 210 shown in FIG. 2.

Referring to FIG. 3, the input signal latch unit 210 includes a first latch 310, a second latch 320, a third latch 330, and a fourth latch 340. The first to fourth latches 310 to 340 latch one input signal among the first to fourth input signals INS1 to INS4 in response to the first to fourth clocks CLK1 to CLK4, respectively. Additionally, the input signal latch unit 210 includes first to fourth latch lines LAT1 to LAT4.

The first to fourth latches 310 to 340 correspond to the first to fourth latch lines LAT1 to LAT4, respectively, and the first to fourth latches 310 to 340 output the latched input signals to the corresponding latch lines LAT1 to LAT4. Herein, the length of the latched input signals outputted to the first to fourth latch lines LAT1 to LAT4 may be a half of the cycle of the first to fourth clocks CLK1 to CLK4.

Specifically, the first latch 310 corresponds to the first latch line LAT1, and the first latch 310 outputs the latched input signal that is latched in response to the first clock CLK1 among the first to fourth input signals INS1 to INS4 to the first latch line LAT1. The second latch 320 corresponds to the second latch line LAT2, and the second latch 320 outputs the latched input signal that is latched in response to the second clock CLK2 among the first to fourth input signals INS1 to INS4 to the second latch line LAT2. The third latch 330 corresponds to the third latch line LAT3, and the third latch 330 outputs the latched input signal that is latched in response to the third clock CLK3 among the first to fourth input signals INS1 to INS4 to the third latch line LAT3. The fourth latch 340 corresponds to the fourth latch line LAT4, and the fourth latch 340 outputs the latched input signal that is latched in response to the fourth clock CLK4 among the first to fourth input signals INS1 to INS4 to the fourth latch line LAT4.

Figure 4:
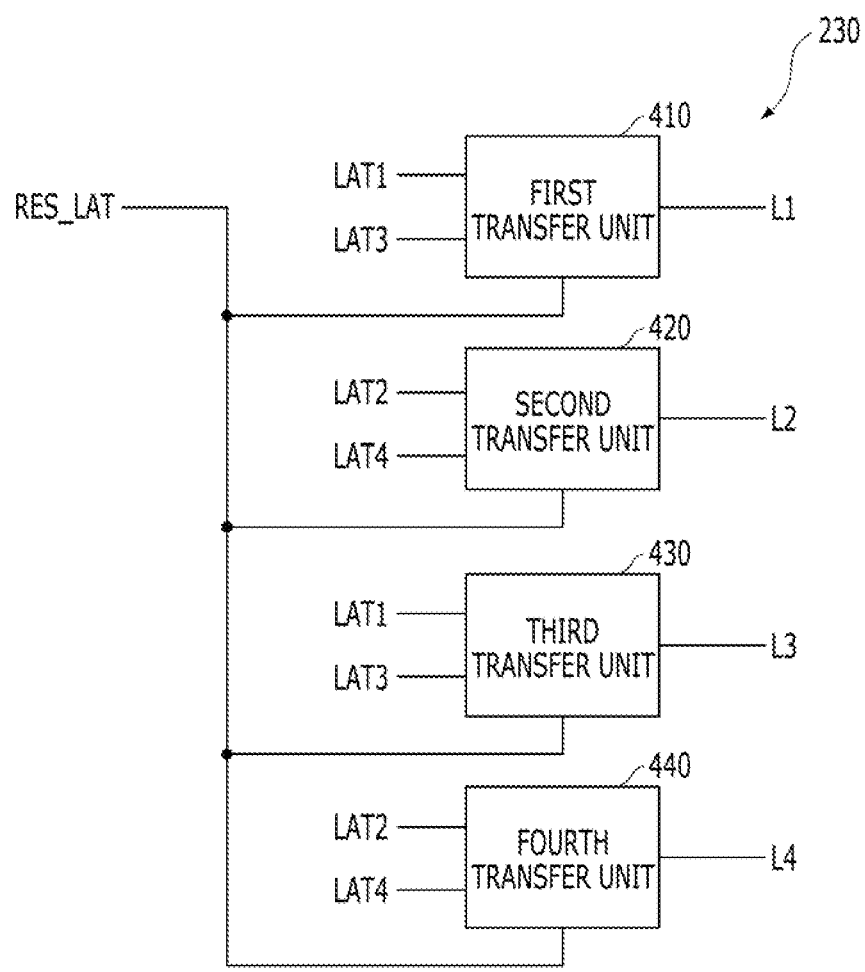
FIG. 4 is a block diagram illustrating a signal transmission unit 230 shown in FIG. 2.

FIG. 4 is a block diagram illustrating the signal transfer unit 230 shown in FIG. 2.

Referring to FIG. 4, the signal transfer unit 230 includes a first transfer unit 410, a second transfer unit 420, a third transfer unit 430, and a fourth transfer unit 440. The first transfer unit 410 transfers one between the output LAT1 of the first latch 310 and the output LAT3 of the third latch 330 to the first output line L1 in response to the latch result RES_LAT of the valid signal latch unit 220. The second transfer unit 420 transfers one between the output LAT2 of the second latch 320 and the output LAT4 of the fourth latch 340 to the second output line L2 in response to the latch result RES_LAT of the valid signal latch unit 220. The third transfer unit 430 transfers one between the output LAT1 of the first latch 310 and the output LAT3 of the third latch 330 to the third output line L3 in response to the latch result RES_LAT of the valid signal latch unit 220. The fourth transfer unit 440 transfers one between the output LAT2 of the second latch 320 and the output LAT4 of the fourth latch 340 to the fourth output line L4 in response to the latch result RES_LAT of the valid signal latch unit 220.

Described hereafter is the signal transfer unit 230 with reference to FIGS. 2 and 4.

The first transfer unit 410 transfers the output LAT1 of the first latch 310 to the first output line L1, the second transfer unit 420 transfers the output LAT2 of the second latch 320 to the second output line L2, the third transfer unit 430 transfers the output LAT3 of the third latch 330 to the third output line L3, and the fourth transfer unit 440 transfers the output LAT4 of the fourth latch 340 to the fourth output line L4, in response to the result corresponding to when the first input signal INS1 is latched in response to the first clock CLK1 among the latch results RES_LAT of the valid signal VAL described above with reference to FIG. 2.

The first transfer unit 410 transfers the output LAT3 of the third latch 330 to the first output line L1, the second transfer unit 420 transfers the output LAT4 of the fourth latch 340 to the second output line L2, the third transfer unit 430 transfers the output LAT1 of the first latch 310 to the third output line L3, and the fourth transfer unit 440 transfers the output LAT2 of the second latch 320 to the fourth output line L4, in response to the result corresponding to when the first input signal INS1 is latched in response to the third clock CLK3 among the latch results RES_LAT of the valid signal VAL described above with reference to FIG. 2.

FIGS. 5A to 5D are waveform diagrams describing an operation of the semiconductor device.

Figure 5A:
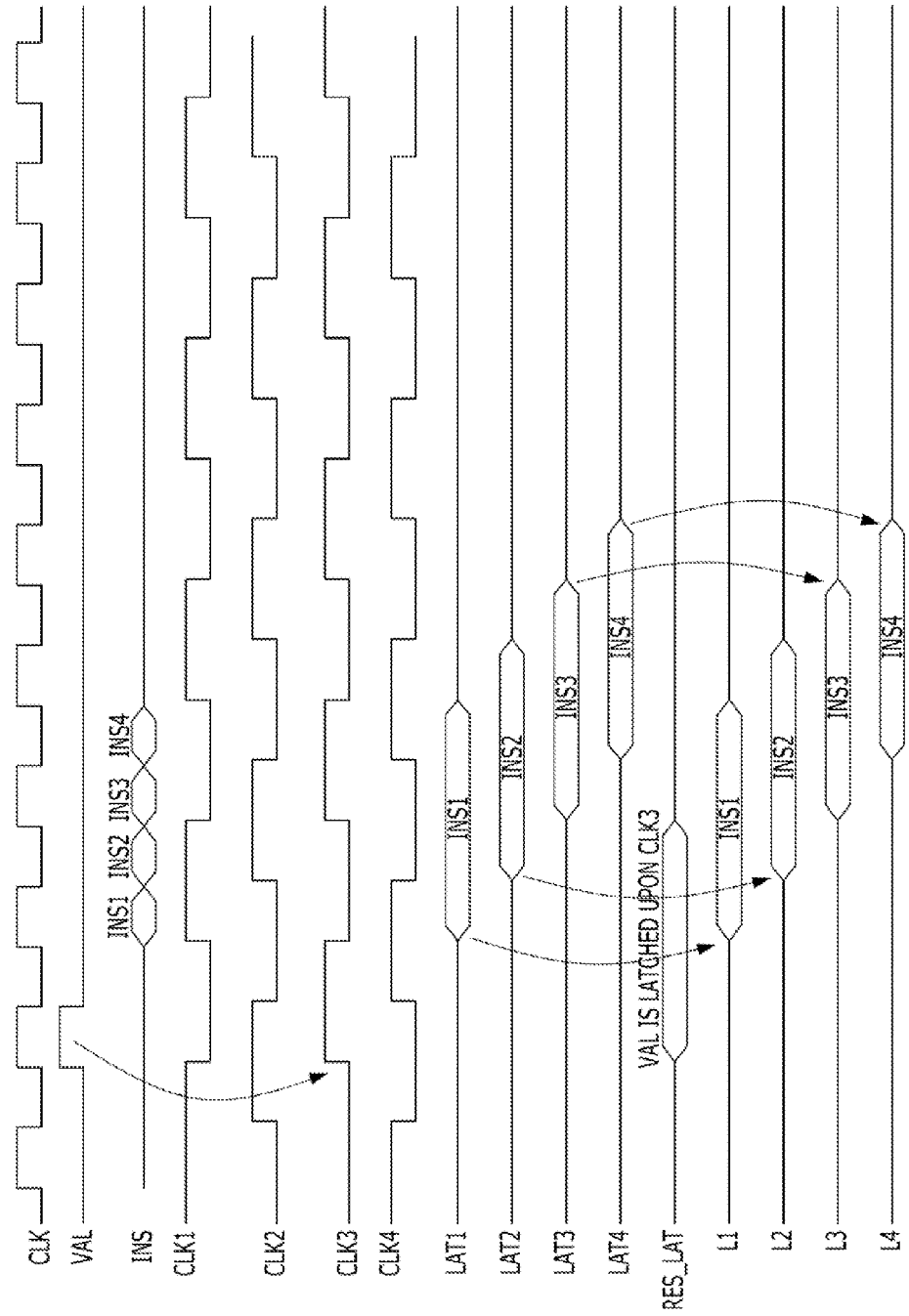
Figure 5B:
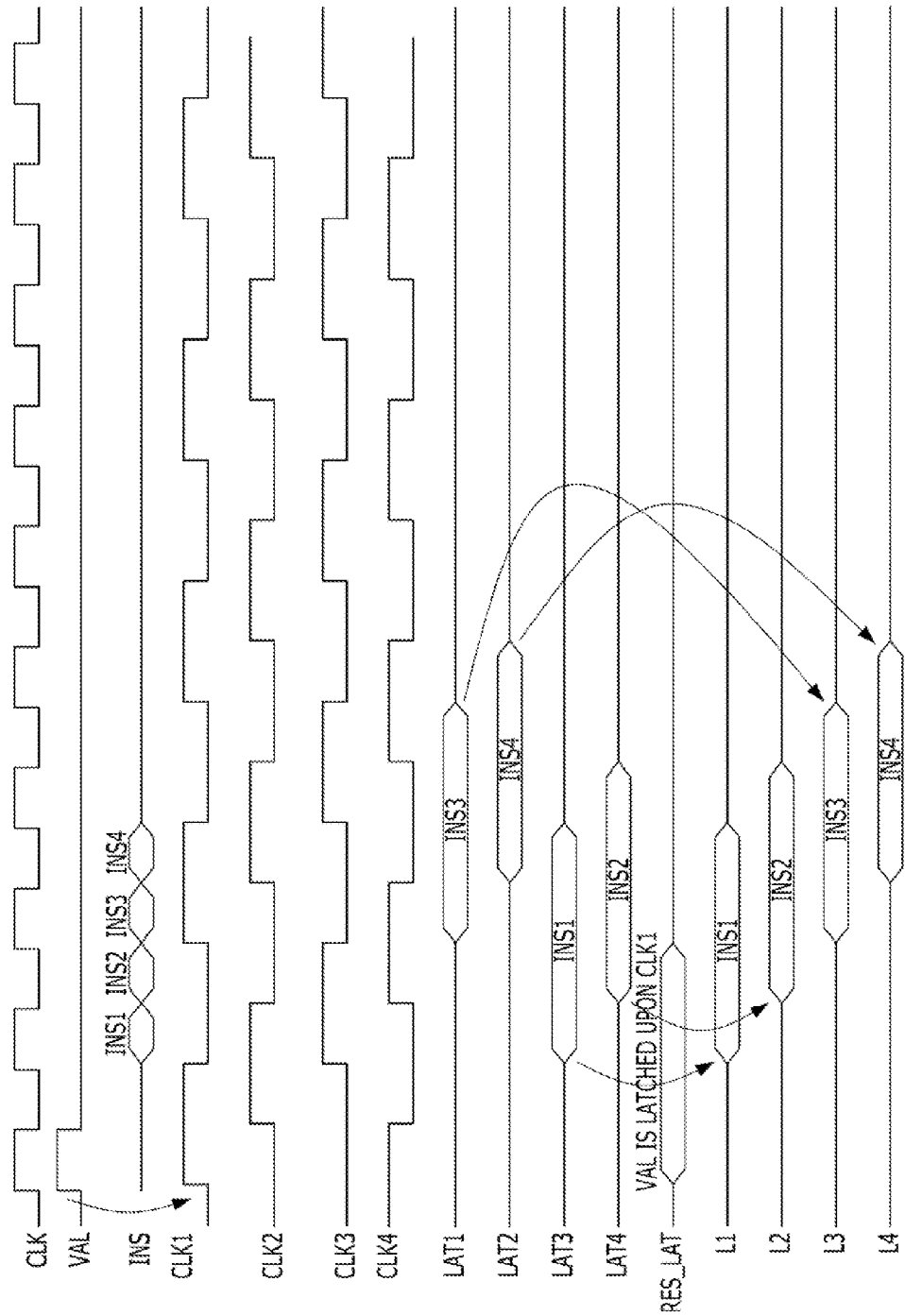

FIGS. 5A and 5B are waveform diagrams illustrating when the valid signal VAL corresponds to the first input signal INS1 and the valid signal VAL is inputted ahead of the first input signal INS1 by an odd-number of cycles (e.g., one) of the clock signal.

Referring to FIG. 5A, when the valid signal VAL is latched in response to the third clock CLK3, the first to fourth input signals INS1 to INS4 are latched in response to the first to fourth clocks CLK1 to CLK4, and transferred to the first to fourth latch lines LAT1 to LAT4, respectively. Subsequently, the signal transfer unit 230 as shown in FIG. 2 transfers the latched input signals of the first to fourth latch lines LAT1 to LAT4 to the first to fourth output lines L1 to L4, respectively, in response to the latch result RES_LAT.

Referring to FIG. 5B, when the valid signal VAL is latched in response to the first clock CLK1, the first to fourth input signals INS1 to INS4 are latched in response to the third clock CLK3, the fourth clock CLK4, the first clock CLK1, and the second clock CLK2, and transferred to the third latch line LAT3, the fourth latch line LAT4, the first latch line LAT1, and the second latch line LAT2, respectively. Subsequently, the signal transfer unit 230 as shown in FIG. 2 transfers the input signals of the third latch line LAT3, the fourth latch line LAT4, the first latch line LAT1, and the second latch line LAT2 to the first to fourth output lines L1 to L4, respectively, in response to the latch result RES_LAT.

FIGS. 5C and 5D are waveform diagrams illustrating when the valid signal VAL corresponds to the first input signal INS1 and the valid signal VAL is inputted ahead of the first input signal INS1 by an even-number of cycles (e.g., two) of the clock signal.

Referring to FIG. 5C, when the valid signal VAL is latched in response to the first clock CLK1, the first to fourth input signals INS1 to INS4 are latched in response to the first to fourth clocks CLK1 to CLK4, and transferred to the first to fourth latch lines LAT1 to LAT4, respectively. Subsequently, the signal transfer unit 230 transfers the latched input signals of the first to fourth latch lines LAT1 to LAT4 to the first to fourth output lines L1 to L4, respectively, in response to the latch result RES_LAT.

Referring to FIG. 5D, when the valid signal VAL is latched in response to the third clock CLK3, the first to fourth input signals INS1 to INS4 are latched in response to the third clock CLK3, the fourth clock CLK4, the first clock CLK1, and the second clock CLK2, and transferred to the third latch line LAT3, the fourth latch line LAT4, the first latch line LAT1, and the second latch line LAT2, respectively. Subsequently, the signal transfer unit 230 as shown in FIG. 2 transfers the input signals of the third latch line LAT3, the fourth latch line LAT4, the first latch line LAT1, and the second latch line LAT2 to the first to fourth output lines L1 to L4, respectively, in response to the latch result RES_LAT.

Figure 6:
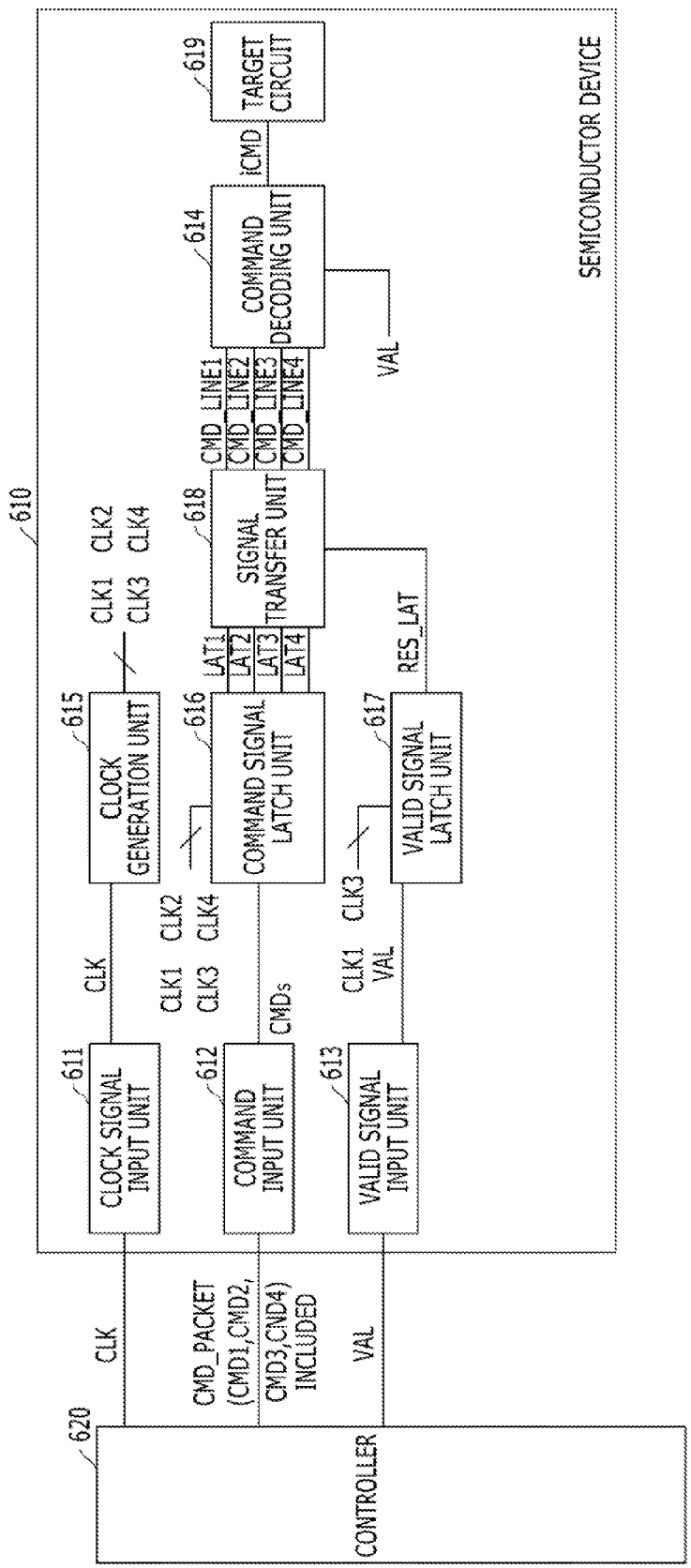
FIG. 6 is a block diagram illustrating a semiconductor system in accordance with an embodiment of the present invention.

FIG. 6 is a block diagram illustrating a semiconductor system in accordance with an embodiment of the present invention.

Referring to FIG. 6, the semiconductor system includes a semiconductor device 610 and a controller 620. The semiconductor device 610 includes a clock signal input unit 611, a command input unit 612, a valid signal input unit 613, a command decoding unit 614, a clock generation unit 615, a command signal latch unit 616, a valid signal latch unit 617, and a signal transfer unit 618. The clock signal input unit 611 receives a clock signal CLK. The command input unit 612 receives one or more command packets CMD_PACKET, and each command packet CMD_PACKET includes command signals CMD1 to CMD4 that are sequentially inputted. The valid signal input unit 613 receives a valid signal VAL. The command decoding unit 614 generates an internal command iCMD by decoding one or more command packets CMD_PACKET that are transferred through first to fourth command lines CMD_LINE1 to CMD_LINE4 when the command packets CMD_PACKET inputted to the command input unit 612 are valid. The clock generation unit 615 generates first to fourth clocks CLK1 to CLK4 based on the clock signal CLK. The command signal latch unit 616 latches the first to fourth command signals CMD1 to CMD4 in response to the first to fourth clocks CLK1 to CLK4. The valid signal latch unit 617 latches the valid signal VAL in response to one of the first and third clocks CLK1 and CLK3. The signal transfer unit 618 transfers the command signals that are latched in response to the first to fourth clocks CLK1 to CLK4 to the first to fourth command lines CMD_LINE1 to CMD_LINE4 based on the corresponding relationship that is determined based on the latch result RES_LAT of the valid signal latch unit 617. The valid signal VAL corresponds to one command signal among the first to fourth command signals CMD1 to CMD4, and it represents whether or not the corresponding command signal is valid. Described hereafter is a case where the valid signal VAL corresponds to the first command signal CMD1 and represents whether or not the first command signal CMD1 is valid.

Hereafter, the semiconductor system is described with reference to FIG. 6.

The controller 620 inputs one or more command packets CMD_PACKET into the semiconductor device 610 to control the semiconductor device 610 to perform a predetermined operation. The first to fourth command signals CMD1 to CMD4 included in the command packets CMD_PACKET are sequentially inputted to the semiconductor device 610. Additionally, the controller 620 inputs a clock signal CLK into the semiconductor device 610 so that the semiconductor device 610 may receive the command packets CMD_PACKET in synchronization with the clock signal CLK. The controller 620 also inputs a valid signal VAL that represents whether or not the first command signal CMD1 among the first to fourth command signals CMD1 to CMD4 included in the command packets CMD_PACKET is valid when it inputs the clock signal CLK into the semiconductor device 610. The controller 620 may input the valid signal VAL ahead of the first command signal CMD1 by an odd-number of cycles of the clock signal CLK or an even-number of cycles of the clock signal CLK.

The clock signal input unit 611 receives the clock signal CLK that is inputted from the controller 620. The clock signal input unit 611 may include one or more clock pins (not shown in FIG. 6) to be coupled with the controller 620. The command input unit 612 receives one or more command packets CMD_PACKET that are inputted from the controller 620. The command input unit 612 may include one or more command pins (not shown in FIG. 6) to be coupled with the controller 620. The valid signal input unit 613 receives the valid signal VAL inputted from the controller 620. The valid signal input unit 613 may include one or more valid signal pins (not shown in FIG. 6) to be coupled with the controller 620. Described hereafter is a case where the clock signal input unit 611, the command input unit 612, and the valid signal input unit 613 include one pin, individually. The number of pins included in the clock signal input unit 611, the command input unit 612, and the valid signal input unit 613 may vary depending on how they are designed.

When the semiconductor device 610 is a semiconductor memory device, the controller 620 may input an address and data into the semiconductor device 610. The semiconductor device 610 may further include other input units to receive the address and the data.

The structures and operations of the clock generation unit 615, the command signal latch unit 616, the valid signal latch unit 617, and the signal transfer unit 618 shown in FIG. 6 are the same as the structures and operations of the clock generation unit 240, the input signal latch unit 210, the valid signal latch unit 220, and the signal transfer unit 230. The first to fourth command signals CMD1 to CMD4 shown in FIG. 6 correspond to the first to fourth input signals INS1 to INS4 shown in FIG. 2, and the first to fourth command lines CMD_LINE1 to CMD_LINE4 shown in FIG. 6 correspond to the first to fourth output lines L1 to L4 shown in FIG. 2. The clock generation unit 615, the command signal latch unit 616, the valid signal latch unit 617, and the signal transfer unit 618 shown in FIG. 6 transfer the first to fourth command signals CMD1 to CMD4 to the first to fourth command lines CMD_LINE1 to CMD_LINE4 in the order that they are inputted through the process described with reference to FIG. 2, regardless of which clock is used to latch the first to fourth command signals CMD1 to CMD4 among the first to fourth clocks CLK1 to CLK4.

The command decoding unit 614 generates an internal command iCMD by decoding the first to fourth command signals CMD1 to CMD4 that are transferred to the first to fourth command lines CMD_LINE1 to CMD_LINE4 in response to the valid signal VAL, when the first command signal CMD1 is valid. The command decoding unit 614 does not generate an internal command iCMD in response to the valid signal VAL, when the first command signal CMD1 is invalid.

The internal command iCMD is a command used in the semiconductor device 610 and it performs a function of commanding a target circuit 619 to perform a predetermined operation. When the semiconductor device 610 is a semiconductor memory device, the internal command iCMD may be an active command, a read command, a write command, a precharge command, a refresh command, a Mode Register Set (MRS) command for setting an operation mode, or a ZQ calibration command. Besides, the internal command iCMD may be a command signal for performing a predetermined operation in the semiconductor device 610.

The target circuit 619 is a circuit that performs an operation directed by the internal command iCMD in response to the internal command iCMD. For example, when the internal command iCMD is an active command, the target circuit 619 may be a control circuit for controlling the enabling/disabling of a plurality of word lines each of which is coupled with a plurality of memory cells. Herein, among the multiple word lines of the target circuit 619, a word line that is selected based on an address inputted into another input unit may be activated.

When the internal command iCMD is a read command, the target circuit 619 may be a cell array including a plurality of memory cells and a data output circuit for aligning the data outputted from the cell array and outputting the aligned data. Herein, among the multiple memory cells of the target circuit 619, data of the memory cells that are selected based on an address inputted into another input unit may be read.

When the internal command iCMD is a write command, the target circuit 619 may be a cell array and a data input circuit for aligning and driving external data inputted from the outside and transferring the data to the cell array. Herein, among the multiple memory cells of the target circuit 619, data inputted from the other input units may be written into the memory cells that are selected based on an address inputted into the other input units.

When the internal command iCMD is a Mode Register Set (MRS) command, the target circuit 619 may be a configuration circuit for setting an operation mode of the semiconductor device and a mode register set circuit for storing configuration details. Herein, the configuration circuit may diversely set the operation mode of the semiconductor device 610 based on the addresses inputted to the other input units.

When the internal command iCMD is a ZQ calibration command, the target circuit 619 may be a calibration circuit for performing a ZQ calibration operation. Besides, the target circuit 619 may be diverse kinds of circuits for performing an operation directed by the internal command iCMD.

In the semiconductor system according to the embodiment of the present invention, the semiconductor device transfers the command signals that are sequentially inputted to a predetermined command line in the order that the command signals are inputted by using a valid signal, regardless of which clock is used to latch the inputted command signals among a plurality of clocks having different phases. Therefore, the order that the multiple command signals are inputted may be accurately known in the semiconductor device. Knowing an input order of the input signal means that its function depending on the input order may be determined. Therefore, the functions of command signals that are inputted in the form of a packet may be accurately detected and the command packet may be used according to their functions.

Figure 7:
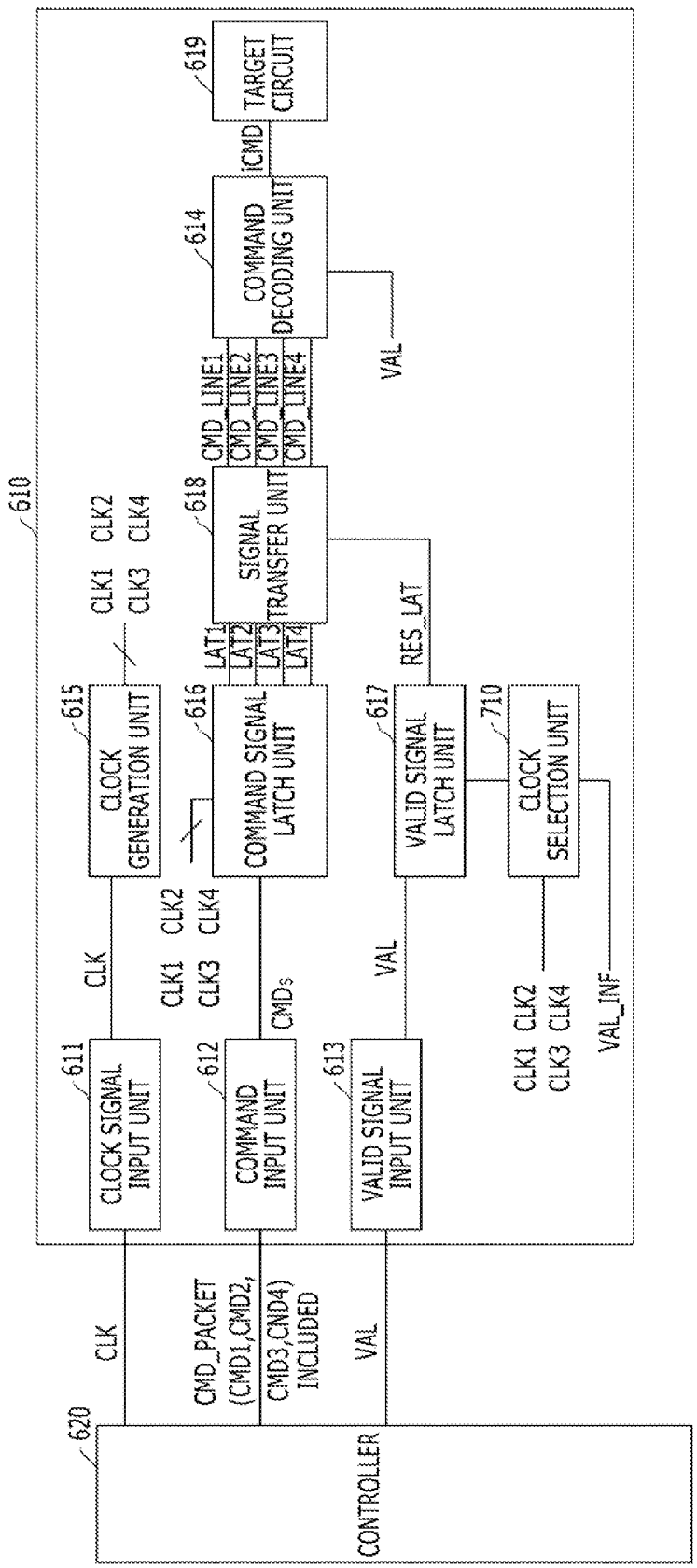
FIG. 7 is a block diagram illustrating a semiconductor system in accordance with another embodiment of the present invention.

FIG. 7 is a block diagram illustrating a semiconductor system in accordance with another embodiment of the present invention.

The semiconductor system of FIG. 7 is different from the semiconductor system of FIG. 6 in that it further includes a clock selection unit 710 in the semiconductor device 610.

When the valid signal VAL corresponds to the first input signal INS1 or the third input signal INS3, the clock selection unit 710 selects one or more clocks between the first clock CLK1 and the third clock CLK3 and transfers the selected clocks to the valid signal latch unit 617. When the valid signal VAL corresponds to the second input signal INS2 or the fourth input signal INS4, the clock selection unit 710 selects one or more clocks between the second clock CLK2 and the fourth clock CLK4 and transfers the selected clocks to the valid signal latch unit 617.

Valid signal information VAL_INF is information representing which input signal the valid signal VAL corresponds to among the first to fourth input signals INS1 to INS4. The valid signal information VAL_INF may be generated internally in the semiconductor device 610, or it may be inputted from the controller 620.

The valid signal latch unit 617 latches the valid signal VAL by using the clocks that are selected in and transferred from the clock selection unit 710, and outputs a latch result RES_LAT. Since other structures and operations are the same as those described with reference to FIGS. 2 and 6, a description of them are omitted herein.

FIG. 8 is a flowchart describing a method for operating a semiconductor device in accordance with an embodiment of the present invention.

Referring to FIG. 8, the method for operating a semiconductor device includes: inputting a clock signal CLK, first to fourth input signals INS1 to INS4, and a valid signal VAL at step S810 (signal input step); generating first to fourth clock synchronized with a first edge of the clock signal CLK, a second clock synchronized with a second edge of the clock signal CLK, a third clock synchronized with a third edge of the clock signal CLK, and a fourth clock synchronized with a fourth edge of the clock signal CLK, where the first edge and the third edge are the same while the second edge and the fourth edge are the same at step S820 (clock generation step); latching the valid signal VAL in response to the first to fourth clocks CLK1 to CLK4 and latching the other valid signals in response to the third clock CLK3 at step S830 (valid signal latch step); latching the first to fourth input signals INS1 to INS4 in response to the first to fourth clocks CLK1 to CLK4 at step S840 (input signal latch step); and transferring the latched input signals that are obtained by latching the input signals in response to the first to fourth clocks CLK1 to CLK4 according to a corresponding relationship that is determined based on the valid signal latch result RES_LAT as first to fourth output signals at step S850 (signal transfer step). The first to fourth output signals are the signals loaded on the first to fourth output lines L1 to L4 in FIG. 2.

Hereafter, a method for operating the semiconductor device is described with reference to FIGS. 2 and 7.

At the signal input step S810, the semiconductor device receives the clock signal CLK, the first to fourth input signals INS1 to INS4, and the valid signal VAL. The valid signal VAL corresponds to one input signal among the first to fourth input signals INS1 to INS4, and the valid signal VAL represents whether or not the corresponding input signal is valid. The valid signal VAL may be inputted ahead of the corresponding input signal by an odd-number or an even-number of cycles of the clock signal CLK.

At the clock generation step S820, the semiconductor device generates the first to fourth clocks CLK1 to CLK4 by using the inputted clock signal CLK. The cycle of the first to fourth clocks CLK1 to CLK4 may be twice as long as the cycle of the clock signal CLK, and the first to fourth clocks CLK1 to CLK4 are synchronized with the first to fourth edges of the clock signal CLK, respectively. Herein, the first edge and the third edge may be rising edges while the second edge and the fourth edge may be falling edges, or the first edge and the third edge may be falling edges while the second edge and the fourth edge may be rising edges.

At the valid signal latch step S830, the valid signal VAL is latched in response to one clock among the first to fourth clocks CLK1 to CLK4, and the latch result RES_LAT is outputted. Herein, the corresponding relationship between the latched input signals, which are obtained by latching the input signals in response to the first to fourth clocks CLK1 to CLK4, and the first to fourth output signals may vary in response to the latch result RES_LAT at the signal transfer step S850. The first to fourth output signals may be the signals loaded on the first to fourth output lines L1 to L4 in FIG. 2, respectively.

At the input signal latch step S840, the first to fourth input signals INS1 to INS4 are latched in response to the first to fourth clocks CLK1 to CLK4. The first input signal INS1 may be latched in response to the first clock CLK1 or the third clock CLK3. When first input signal INS1 is latched in response to the first clock CLK1, the second to fourth input signals INS2 to INS4 are latched in response to the second to fourth clocks CLK2 to CLK4, respectively. When first input signal INS1 is latched in response to the third clock CLK3, the second input signal INS2 is latched in response to the fourth clock CLK4, and the third and fourth input signals INS3 and INS4 are latched in response to the first and second clocks CLK1 and CLK2, respectively.

At the signal transfer step S850, the latched input signals, which are obtained by latching the input signals in response to the first to fourth clocks CLK1 to CLK4, are transferred as the first to fourth output signals based on the corresponding relationship that is determined based on the valid signal latch result RES_LAT. Referring back to FIG. 2, a first latched input signal obtained by latching an input signal in response to the first clock CLK1 is transferred as a first output signal, a second latched input signal obtained by latching an input signal in response to the second clock CLK2 is transferred as a second output signal, a third latched input signal obtained by latching an input signal in response to the third clock CLK3 is transferred as a third output signal, and a fourth latched input signal obtained by latching an input signal in response to the fourth clock CLK4 is transferred as a fourth output signal, in response to a result corresponding to when the first input signal INS1 is latched in response to the first clock CLK1 among the latch results of the valid signal VAL. Additionally, in response to a result corresponding to when the first input signal INS1 is latched in response to the third clock CLK3 among the latch results of the valid signal VAL, the first latched input signal obtained by latching an input signal in response to the first clock CLK1 is transferred as a third output signal, the second latched input signal obtained by latching an input signal in response to the second clock CLK2 is transferred as a fourth output signal, the third latched input signal obtained by latching an input signal in response to the third clock CLK3 is transferred as a first output signal, and the fourth latched input signal obtained by latching an input signal in response to the fourth clock CLK4 is transferred as a second output signal.

As described above, the method for operating a semiconductor device in accordance with the embodiment of the present invention is capable of transferring the input signals that are sequentially inputted in the order that the input signals are inputted by using a valid signal, regardless of which clock is used to latch the input signals among a plurality of clocks having different phases. Therefore, the order that the multiple input signals are inputted may be accurately known in the semiconductor device. Knowing an input order of the input signal means that its function depending on the input order may be determined. Therefore, the functions of multiple input signals that are inputted in the form of a packet may be accurately detected and the input packet may be used according to their functions.

Described above is the case where the number of input signals is four but the technology of the present invention may be applied to a case where the number of input signals is more than four. Also, the technology of the present invention may be applied to a case where the total length of the input signals that are inputted in plural in the form of a packet is longer than the cycle of the clock signal that is inputted along with the input signals.

According to an embodiment of the present invention, a packet including a plurality of command signals may be processed by transferring the multiple command signals included in the packet to a predetermined line in the order that the command signals are inputted by using a valid signal, regardless of what clock is used to latch the command signals.

According to an embodiment of the present invention, commands for diverse additional operations may be generated by processing the command signals that are inputted in the form of a packet, and high-speed operation may be achieved.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   first to fourth output lines;
   an input signal latch unit suitable for latching first to fourth input signals that are sequentially inputted in response to first to fourth clocks having sequential phases, respectively;
   a valid signal latch unit suitable for latching a valid signal in response to one clock among the first to fourth clocks, where the valid signal corresponds to one input signal among the first to fourth input signals and represents whether the corresponding input signal is valid or not; and
   a signal transfer unit suitable for transferring the latched input signals, which are obtained by latching the input signals in response to the first to fourth clocks, to the first to fourth output lines based on a correspondence relationship that is decided based on a valid signal latch result of the valid signal latch unit.

2. The semiconductor device of claim 1, further comprising:
   a clock generation unit suitable for generating first to fourth clocks corresponding to the first to fourth input signals and in synchronization with first to fourth edges of a clock signal, respectively, wherein a cycle of the clock signal is a half of the cycles of the first to fourth clocks.

3. The semiconductor device of claim 2, wherein
when the valid signal corresponds to the first input signal and the valid signal is inputted to the semiconductor device ahead of the first input signal by an odd-number of cycles of the clock signal and latched in response to the first clock, the signal transfer unit transfers the first to fourth latched input signals to the third output line, the fourth output line, the first output line and the second output line, respectively;

when the valid signal corresponds to the first input signal and the valid signal is inputted to the semiconductor device ahead of the first input signal by an odd-number of cycles of the clock signal and latched in response to the third clock, the signal transfer unit transfers the first to fourth latched input signals to the first to fourth output lines, respectively;

when the valid signal corresponds to the first input signal and the valid signal is inputted to the semiconductor device ahead of the first input signal by an even-number of cycles of the clock signal and latched in response to the third clock, the signal transfer unit transfers the first to fourth latched input signals to the third output line, the fourth output line, the first output line and the second output line, respectively; and when the valid signal corresponds to the first input signal and the valid signal is inputted to the semiconductor device ahead of the first input signal by an even-number of cycles of the clock signal and latched in response to the first clock, the signal transfer unit transfers the first to fourth latched input signals to the first to fourth output lines, respectively.

4. The semiconductor device of claim 2, wherein
when the valid signal corresponds to the second input signal and the valid signal is inputted to the semiconductor device ahead of the second input signal by an odd-number of cycles of the clock signal and latched in response to the second clock, the signal transfer unit transfers the first to fourth latched input signals to the third output line, the fourth output line, the first output line and the second output line, respectively;

when the valid signal corresponds to the second input signal and the valid signal is inputted to the semiconductor device ahead of the second input signal by an odd-number of cycles of the clock signal and latched in response to the fourth clock, the signal transfer unit transfers the first to fourth latched input signals to the first to fourth output lines, respectively;

when the valid signal corresponds to the second input signal and the valid signal is inputted to the semiconductor device ahead of the second input signal by an even-number of cycles of the clock signal and latched in response to the fourth clock, the signal transfer unit transfers the first to fourth latched input signals to the third output line, the fourth output line, the first output line and the second output line, respectively; and when the valid signal corresponds to the second input signal and the valid signal is inputted to the semiconductor device ahead of the second input signal by an even-number of cycles of the clock signal and latched in response to the second clock, the signal transfer unit transfers the first to fourth latched input signals to the first to fourth output lines, respectively.

5. The semiconductor device of claim 2, wherein
when the valid signal corresponds to the third input signal and the valid signal is inputted to the semiconductor device ahead of the third input signal by an odd-number of cycles of the clock signal and latched in response to the third clock, the signal transfer unit transfers the first to fourth latched input signals to the third output line, the fourth output line, the first output line and the second output line, respectively;

when the valid signal corresponds to the third input signal and the valid signal is inputted to the semiconductor device ahead of the third input signal by an odd-number of cycles of the clock signal and latched in response to the first clock, the signal transfer unit transfers the first to fourth latched input signals to the first to fourth output lines, respectively;

when the valid signal corresponds to the third input signal and the valid signal is inputted to the semiconductor device ahead of the third input signal by an even-number of cycles of the clock signal and latched in response to the first clock, the signal transfer unit transfers the first to fourth latched input signals to the third output line, the fourth output line, the first output line and the second output line, respectively; and when the valid signal corresponds to the third input signal and the valid signal is inputted to the semiconductor device ahead of the third input signal by an even-number of cycles of the clock signal and latched in response to the third clock, the signal transfer unit transfers the first to fourth latched input signals to the first to fourth output lines, respectively.

6. The semiconductor device of claim 2, wherein
when the valid signal corresponds to the fourth input signal and the valid signal is inputted to the semiconductor device ahead of the fourth input signal by an odd-number of cycles of the clock signal and latched in response to the fourth clock, the signal transfer unit transfers the first to fourth latched input signals to the third output line, the fourth output line, the first output line and the second output line, respectively;

when the valid signal corresponds to the fourth input signal and the valid signal is inputted to the semiconductor device ahead of the fourth input signal by an odd-number of cycles of the clock signal and latched in response to the second clock, the signal transfer unit transfers the first to fourth latched input signals to the first to fourth output lines, respectively;

when the valid signal corresponds to the fourth input signal and the valid signal is inputted to the semiconductor device ahead of the fourth input signal by an even-number of cycles of the clock signal and latched in response to the second clock, the signal transfer unit transfers the first to fourth latched input signals to the third output line, the fourth output line, the first output line and the second output line, respectively; and when the valid signal corresponds to the fourth input signal and the valid signal is inputted to the semiconductor device ahead of the fourth input signal by an even-number of cycles of the clock signal and latched in response to the fourth clock, the signal transfer unit transfers the first to fourth latched input signals to the first to fourth output lines, respectively.

7. The semiconductor device of claim 2, wherein the input signal latch unit includes:
a first latch suitable for latching one input signal among the first to fourth input signals and outputting the first latched input signal in response to the first clock;
a second latch suitable for latching one input signal among the first to fourth input signals and outputting the second latched input signal in response to the second clock;

a third latch suitable for latching one input signal among the first to fourth input signals and outputting the third latched input signal in response to the third clock; and a fourth latch suitable for latching one input signal among the first to fourth input signals and outputting the fourth latched input signal in response to the fourth clock.

8. The semiconductor device of claim 7, wherein the signal transfer unit includes:

a first transfer unit suitable for transferring one of the first and third latched input signals to the first output line in response to the valid signal latch result;

a second transfer unit suitable for transferring one of the second and fourth latched input signals to the second output line in response to the valid signal latch result;

a third transfer unit suitable for transferring one of the first and third latched input signals to the third output line in response to the valid signal latch result; and a fourth transfer unit suitable for transferring one of the second and fourth latched input signals to the fourth output line in response to the valid signal latch result.

9. The semiconductor device of claim 2, wherein the first edge and third edge are rising edges, while the second edge and fourth edge are falling edges, or the first edge and third edge are falling edges, while the second edge and fourth edge are rising edges.

10. A semiconductor system, comprising:

a controller suitable for generating a clock signal, at least one command packet including first to fourth sequential command signals, and a valid signal corresponding to one of the first to fourth command signals representing whether or not the one command signal is valid; and a semiconductor device, suitable for generating first to fourth clocks synchronized with first to fourth edges of the clock signal, respectively, latching the command packet in response to the first to fourth clocks to output first to fourth latched command signals, respectively, latching the valid signal using the first to fourth clocks to output a valid signal latch result, transferring the first to fourth latched command signals to first to fourth command lines in an order determined by the valid signal latch result, and performing a set operation corresponding to the at least one command packet.

11. The semiconductor system of claim 10, wherein the semiconductor device comprises:

a clock signal input unit suitable for receiving the clock signal;

a command input unit suitable for receiving the at least one command packet;

a valid signal input unit suitable for receiving the valid signal; and a command decoding unit for generating an internal command by decoding the first to fourth latched command signals transferred through the first to fourth command lines in response to the valid signal.

12. The semiconductor system of claim 10, wherein the semiconductor device comprises:

a clock generation unit suitable for generating the first to fourth clocks based on the clock signal;

a command signal latch unit suitable for latching the first to fourth command signals in response to the first to fourth clocks;

a valid signal latch unit suitable for latching the valid signal in response to one clock among the first to fourth clocks; and a signal transfer unit suitable for transferring the first to fourth latched command signals to the first to fourth command lines in an order determined by the one clock.

13. The semiconductor system of claim 10, wherein the first to fourth clocks have a cycle twice as long as a cycle of the clock signal, and the first and third edges of the clock signal are the same kind while the second and fourth edges thereof are the same kind.

14. The semiconductor system of claim 13, wherein the semiconductor device further comprises:

a clock selection unit suitable for selecting at least one clock between the first clock and the third clock and transferring the selected clock to the valid signal latch unit when the valid signal corresponds to the first input signal or the third input signal, and suitable for selecting at least one clock between the second clock and the fourth clock and transferring the selected clock to the valid signal latch unit when the valid signal corresponds to the second input signal or the fourth input signal.

15. A method for operating a semiconductor system, comprising:

inputting a clock signal, first to fourth input signals, and a valid signal which corresponds to one input signal among the first to fourth input signals and represents whether or not the one input signal is valid;

generating first to fourth clocks synchronized with first to fourth edges of the clock signal, where the first edge and the third edge are of the same kind while the second edge and the fourth edge are of the same kind;

latching the valid signal using the first to fourth clocks and outputting a valid signal latch result;

latching the input signals in response to the first to fourth clocks to output first to fourth latched input signals, respectively; and transferring the latched input signals as first to fourth output signals in an order determined by the valid signal latch result.

16. The method of claim 15, wherein the first to fourth clocks have a cycle twice as long as a cycle of the clock signal.

17. The method of claim 16, wherein the transferring of the latched input signals includes:

transferring the first to fourth latched input signals as the third output signal, the fourth output signal, the first output signal and the second output signal, respectively, when the valid signal corresponds to the first input signal and the valid signal is inputted ahead of the first input signal by an odd-number of cycles of the clock signal and latched in response to the first clock;

transferring the first to fourth latched input signals as the first to fourth output signals, respectively, when the valid signal corresponds to the first input signal and the valid signal is inputted ahead of the first input signal by an odd-number of cycles of the clock signal and latched in response to the third clock;

transferring the first to fourth latched input signals as the third output signal, the fourth output signal, the first output signal and the second output signal, respectively, when the valid signal corresponds to the first input signal and the valid signal is inputted ahead of the first input signal by an even-number of cycles of the clock signal and latched in response to the third clock; and transferring the first to fourth latched input signals as the first to fourth output signals, respectively, when the valid signal corresponds to the first input signal and the valid signal is inputted ahead of the first input signal by an even-number of cycles of the clock signal and latched in response to the first clock.

18. The method of claim 16, wherein the transferring of the latched input signals includes:

transferring the first to fourth latched input signals as the third output signal, the fourth output signal, the first output signal and the second output signal, respectively, when the valid signal corresponds to the second input signal and the valid signal is inputted ahead of the second input signal by an odd-number of cycles of the clock signal and latched in response to the second clock;

transferring the first to fourth latched input signals as the first to fourth output signals, respectively, when the valid signal corresponds to the second input signal and the valid signal is inputted ahead of the second input signal by an odd-number of cycles of the clock signal and latched in response to the fourth clock;

transferring the first to fourth latched input signals as the third output signal, the fourth output signal, the first output signal and the second output signal, respectively, when the valid signal corresponds to the second input signal and the valid signal is inputted ahead of the second input signal by an even-number of cycles of the clock signal and latched in response to the fourth clock; and transferring the first to fourth latched input signals as the first to fourth output signals, respectively, when the valid signal corresponds to the second input signal and the valid signal is inputted ahead of the second input signal by an even-number of cycles of the clock signal and latched in response to the second clock.

19. The method of claim 16, wherein the transferring of the latched input signals includes:

transferring the first to fourth latched input signals as the third output signal, the fourth output signal, the first output signal and the second output signal, respectively, when the valid signal corresponds to the third input signal and the valid signal is inputted ahead of the third input signal by an odd-number of cycles of the clock signal and latched in response to the third clock;

transferring the first to fourth latched input signals as the first to fourth output signals, respectively, when the valid signal corresponds to the third input signal and the valid signal is inputted ahead of the third input signal by an odd-number of cycles of the clock signal and latched in response to the first clock;

transferring the first to fourth latched input signals as the third output signal, the fourth output signal, the first output signal and the second output signal, respectively, when the valid signal corresponds to the third input signal and the valid signal is inputted ahead of the third input signal by an even-number of cycles of the clock signal and latched in response to the first clock; and transferring the first to fourth latched input signals as the first to fourth output signals, respectively, when the valid signal corresponds to the third input signal and the valid signal is inputted ahead of the third input signal by an even-number of cycles of the clock signal and latched in response to the third clock.

20. The method of claim 16, wherein the transferring of the latched input signals includes:

transferring the first to fourth latched input signals as the third output signal, the fourth output signal, the first output signal and the second output signal, respectively, when the valid signal corresponds to the fourth input signal and the valid signal is inputted ahead of the fourth input signal by an odd-number of cycles of the clock signal and latched in response to the fourth clock;

transferring the first to fourth latched input signals as the first to fourth output signals, respectively, when the valid signal corresponds to the fourth input signal and the valid signal is inputted ahead of the fourth input signal by an odd-number of cycles of the clock signal and latched in response to the second clock;

transferring the first to fourth latched input signals as the third output signal, the fourth output signal, the first output signal and the second output signal, respectively, when the valid signal corresponds to the fourth input signal and the valid signal is inputted ahead of the fourth input signal by an even-number of cycles of the clock signal and latched in response to the second clock; and transferring the first to fourth latched input signals as the first to fourth output signals, respectively when the valid signal corresponds to the fourth input signal and the valid signal is inputted ahead of the fourth input signal by an even-number of cycles of the clock signal and latched in response to the fourth clock.

21. A semiconductor device, comprising:

a plurality of output lines;

an input signal latch unit suitable for latching a plurality of input signals that are sequentially inputted in response to a plurality of clocks having sequential phases, respectively;

a valid signal latch unit suitable for latching a valid signal in response to one clock among the multiple clocks, where the valid signal corresponds to one input signal among the multiple input signals and represents whether the corresponding input signal is valid or not; and a signal transfer unit suitable for transferring the latched input signals, which are obtained by latching the input signals in response to the multiple clocks, to the multiple output lines based on a correspondence relationship that is decided based on a valid signal latch result of the valid signal latch unit.

* * * * *